United States Patent [19]

Olego

[11] Patent Number: 4,678,266
[45] Date of Patent: * Jul. 7, 1987

[54] USE OF PNICTIDE FILMS FOR WAVE-GUIDING IN OPTO-ELECTRONIC DEVICES

[75] Inventor: Diego J. Olego, Croton-on-Hudson, N.Y.

[73] Assignee: Stauffer Chemical Company, Westport, Conn.

[*] Notice: The portion of the term of this patent subsequent to Apr. 2, 2002 has been disclaimed.

[21] Appl. No.: 695,255

[22] Filed: Jan. 28, 1985

Related U.S. Application Data

[63] Continuation-in-part of Ser. No. 509,210, Jun. 29, 1983, Pat. No. 4,567,503, which is a continuation-in-part of Ser. No. 581,115, Feb. 17, 1984, abandoned, which is a continuation-in-part of Ser. No. 581,140, Feb. 17, 1984, abandoned, which is a continuation-in-part of Ser. No. 581,171, Feb. 17, 1984, abandoned.

[51] Int. Cl.$^4$ ............................................. G02B 6/10
[52] U.S. Cl. .............................. 350/96.12; 350/96.34; 357/30; 357/61
[58] Field of Search ................. 357/30, 61; 350/96.12, 350/96.34, 96.14

[56] References Cited

U.S. PATENT DOCUMENTS

3,958,263 5/1976 Panish et al. ......................... 372/45
4,509,066 4/1985 Schachter et al. .................... 357/61

OTHER PUBLICATIONS

"Comprehensive Inorganic Chemistry", Pergamon Press, p. 547.
S. M. Sze, "Physics of Semiconductor Devices", published by John Wiley and Sons, pp. 711, 198.
Y. Hirota and T. Kobayashi, "Chemical Vapor Deposition and Characterization of Phosphorous-Nitride ($P_3N_5$) Gate Insulators for $I_nP$ Metal-Insulator-Semiconductor Devices", J. Appl. Phys. 53(7), Jul. 1982, pp. 5037-5043.

*Primary Examiner*—Robert E. Wise
*Attorney, Agent, or Firm*—F. Eugene Davis IV; Mark P. Stone

[57] ABSTRACT

The semiconductor layer of an opto-electronic device has one or more films of a pnictide rich material deposited thereon. The pnictide has a smaller reflective index than the semiconductor layer. These films provide a wave-guiding effect to light within the semiconductor layer in opto-electronic devices, such as solid state lasers and light emitting diodes and wave guides interconnecting such devices.

25 Claims, 1 Drawing Figure

N AND N″ < N′

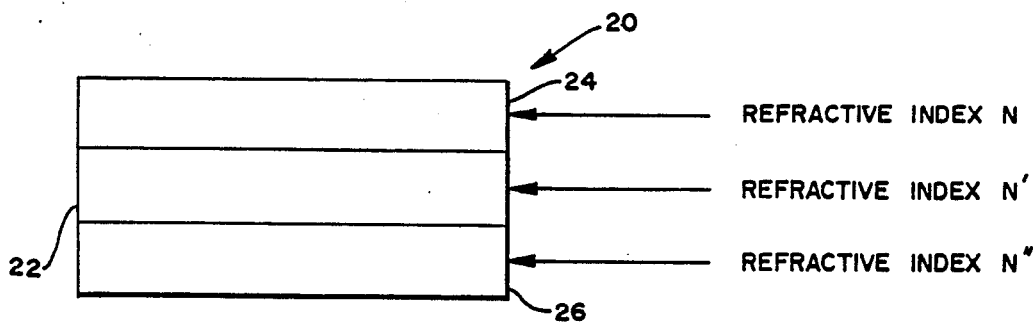
N AND N" < N'

USE OF PNICTIDE FILMS FOR WAVE-GUIDING IN OPTO-ELECTRONIC DEVICES

RELATED APPLICATIONS

This application is a continuation-in-part of 509,210 filed 6/29/83, now U.S. Pat. No. 4,567,503 and a continuation-in-part of 581,115 filed 2/17/84, now abandoned, and a continuation-in-part of 581,140 filed 2/17/84, now abandoned, and a continuation-in-part of 581,171 filed 2/17/84, now abandoned.

TECHNICAL FIELD

This invention relates to the use of pnictide films for wave-guiding in opto-electronic devices; to compound and intermetallic semiconductors; to binary, ternary and quaternary semiconductors; to III-V semiconductors; and to solid state lasers and light emitting diodes.

BACKGROUND ART

Various compound and intermetallic semiconductors containing a pnictide are currently utilized in opto-electronic devices such as solid state lasers and light emitting diodes. In order to provide light guiding in and to and from these devices films are applied thereto having a lower index of refraction than the light containing semiconductor material. However, the native oxides of the semiconductor materials are not good film formers thereon and do not provide good adherence or good interface properties. In accordance with the above-identified U.S. patent application Ser. No. 581,115 filed herewith entitled PASSIVATION AND INSULATION OF III-V DEVICES WITH PNICTIDES, PARTICULARLY AMORPHOUS PNICTIDES HAVING A LAYER-LIKE STRUCTURE, pnictide rich thin films can be grown with good adherence and interface properties on semiconductors comprising a pnictide.

OBJECTS OF THE INVENTION

It is therefore an object of the invention to provide wave-guiding in opto-electronic devices.

Another object of the invention is to provide wave-guiding in opto-electronic devices comprising pnictides.

Still another object of the invention is to provide for wave-guiding in opto-electronic devices comprising binary, ternary, and quaternary semiconductors.

A further object of the invention is to provide for wave-guiding in such opto-electronic devices as solid state lasers and light emitting diodes and wave guides to and from said devices.

Other objects of the invention will in part be obvious and will in part appear hereinafter. The invention accordingly comprises articles of manufacture possessing the features, properties, and the relation of elements which will be exemplified in the articles hereinafter described. The scope of the invention is indicated in the claims.

BRIEF DESCRIPTION OF THE DRAWINGS

For a fuller understanding of the nature and objects of the invention, reference should be had to the following detailed description taken in connection with the accompanying drawing in which the sole FIGURE is a diagrammatic cross sectional view of an opto-electronic device according to the invention.

BEST MODE FOR CARRYING OUT THE INVENTION

Now referring to the FIGURE, an electro-optical device, generally indicated at 20, according to the invention, comprises a semiconductor body 22 of a compound or intermetallic semiconductor. For example, the pnictide containing binary, ternary and quaternary semiconductors currently utilized in opto-electronic devices such as solid state lasers and light emitting diodes. One or more thin pnictide rich layers 24 and 26 are deposited on the body 22. The refractive index of film 24 n and the refractive index of the layer 26 n" are both smaller than the refractive index of the semiconductor body 22 n'. The device 20 may be an active light emitting or light collecting device or it may be a wave guide leading to or from such devices; that is, the semiconductor body 22 may or may not be active electrically.

Since various elemental pnictides and high pnictide polypnictides have been found to be good film formers having good adherence and interface properties to opto-electronic semiconductor materials and since some of these have lower indices of refraction than the semiconductors, the wave guiding contemplated by the invention may be achieved by the construction illustrated in the FIGURE.

The semiconductor body 22 preferably comprises a pnictide so that the pnictide rich layers 24 and 26 obtain some atomic matching with the surface pnictide atoms of the semiconductor body 22.

In particular the semiconductor body 22 may be such III-V materials as GaAs, InP, and GaP and the pnictide rich layer may be phosphorus, for example, monoclinic phosphorus or red phosphorus, or the new form of amorphous phosphorus having a layer-like, puckered, sheet-like local order disclosed in the copending U.S. patent application Ser. No. 581,115 filed herewith, entitled PASSIVATION AND INSULATION OF III-V DEVICES WITH PNICTIDE, PARTICULARLY AMORPHOUS PNICTIDE HAVING A LAYER-LIKE STRUCTURE, other elemental pnictides, or a high pnictide polypnictide such as $MP_x$ where M is an alkali metal, P is a pnictide and x ranges from 15 to infinity, inclusive. Polyphosphides are the preferred polypnictides, particularly potassium polyphosphides.

The semiconductors utilized in my invention comprising pnictides are commonly called intermetallic or compound. III-V semiconductors which are compound, intermetallic, semiconductors comprise elements from column III and column V of the periodic table such as gallium phosphide, gallium arsenide, gallium antimonide, indium phosphide, indium arsenide and indium antimonide and similar ternary and quaternary semiconductors. By pnictide we mean those elements from column V of the periodic table, namely nitrogen, phosphorus, arsenic, antimony and bismuth.

It will thus be seen that the objects set forth above, among those made apparent from the preceding description, are efficiently obtained and, since certain changes may be made in the above disclosed articles without departing from the scope of the invention, it is intended that all matter contained in the above description or shown in the accompanying drawing, shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Particularly, it is to be understood that in said claims ingredients or compounds recited in the singular are intended to include compatible mixtures of such ingredients wherever the sense permits.

Having described may invention what I claim as new and desire to secure by Letters Patent is:

1. An electro-optical device comprising:
   (A) a semiconductor body; and
   (B) at least one pnictide layer for guiding light waves in said body wherein said pnictide layer comprises a material chosen from the group consisting of $MP_x$ and elemental pnictide in non-compound form, where M is an alkali metal, P is a pnictide, and x ranges from 15 to infinity.

2. The device of claim 1 wherein said semiconductor comprises a pnictide.

3. The device of claim 1 wherein said semiconductor body comprises a compound semiconductor.

4. The device of claim 3 wherein said compound semiconductor comprises a pnictide.

5. The device of any one of claims 1 to 4 wherein said pnictide layer comprises $MP_x$, where M is an alkali metal, P is a pnictide, and x ranges from 15 to infinity.

6. The device of claim 5 wherein P is phosphorous.

7. The device of claim 1 wherein said semiconductor body comprises an intermetallic semiconductor.

8. The device of claim 7 wherein said intermetallic semiconductor comprises a pnictide component.

9. The device of any of claims 1, 2, or 7 wherein said pnictide layer comprises phosphorus.

10. The device of claim 9 wherein said layer comprises $MP_x$ where M is an alkali metal, P is phosphorus, and x ranges from 15 to infinity, inclusive.

11. The device of claim 9 wherein said layer is monoclinic.

12. The device of claim 11 wherein said layer is substantially pure phosphorus.

13. The device of claim 9 wherein said layer is substantially pure phosphorus.

14. The device of claim 13 wherein said layer is red phosphorus.

15. The device of claim 9 wherein said pnictide layer comprises phosphorus having a layer-like local order.

16. The device of claim 15 wherein said phosphorus layer is amorphous.

17. The device of any of claims 1, 2, or 7 wherein said layer has a smaller refractive index than said semiconductor body.

18. The device of any of claims 1, 2, or 7 wherein said layer is a polypnictide.

19. The device of claim 18 wherein said polypnictide is $MP_x$ where M is an alkali metal, P is a pnictide and x ranges from 15 to infinity, inclusive.

20. The device of claim 1 wherein said semiconductor body comprises a III–V semiconductor.

21. The device of claim 1 wherein said semiconductor comprises a binary semiconductor.

22. The device of claim 1 wherein said semiconductor body comprises a ternary semiconductor.

23. The device of claim 22 wherein said ternary semiconductor comprises a pnictide.

24. The device of claim 1 wherein said semiconductor comprises a quaternary semiconductor.

25. The device of claim 24 wherein said quaternary semiconductor comprises a pnictide.

* * * * *